(12) United States Patent
Cheng et al.

(10) Patent No.: US 10,134,866 B2
(45) Date of Patent: Nov. 20, 2018

(54) FIELD EFFECT TRANSISTOR AIR-GAP SPACERS WITH AN ETCH-STOP LAYER

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/459,224

(22) Filed: Mar. 15, 2017

(65) Prior Publication Data

US 2018/0269301 A1    Sep. 20, 2018

(51) Int. Cl.
*H01L 21/336*    (2006.01)
*H01L 29/49*    (2006.01)
*H01L 29/78*    (2006.01)
*H01L 29/40*    (2006.01)

(52) U.S. Cl.
CPC ........ *H01L 29/4991* (2013.01); *H01L 29/401* (2013.01); *H01L 29/7851* (2013.01)

(58) Field of Classification Search
CPC .......................... H01L 29/4991; H01L 29/401

USPC .......................................... 257/401; 438/283
See application file for complete search history.

(56) References Cited

U.S. PATENT DOCUMENTS

| | | | |
|---|---|---|---|
| 6,541,835 B1 | 4/2003 | Pettersson et al. | |
| 6,580,352 B1 | 6/2003 | Pino et al. | |
| 7,741,663 B2 | 6/2010 | Hause et al. | |
| 7,754,601 B2 | 7/2010 | Chen et al. | |
| 9,230,911 B2 | 1/2016 | Tsai et al. | |
| 9,230,987 B2* | 1/2016 | Pachamuthu | H01L 27/11582 |
| 9,252,233 B2 | 2/2016 | Hsiao et al. | |
| 9,305,831 B2 | 4/2016 | Ren et al. | |
| 9,305,835 B2 | 4/2016 | Alptekin et al. | |
| 9,768,186 B2* | 9/2017 | Shimabukuro | H01L 23/5226 |
| 2012/0276711 A1 | 11/2012 | Yoon et al. | |
| 2015/0243671 A1* | 8/2015 | Simsek-Ege | H01L 29/66825 257/321 |
| 2016/0111515 A1 | 4/2016 | Besser et al. | |

* cited by examiner

*Primary Examiner* — Caleb Henry
(74) *Attorney, Agent, or Firm* — Cantor Colburn LLP; Vazken Alexanian

(57) ABSTRACT

Provided herewith are embodiments related to a semiconductor structure and a method for forming the semiconductor structure. A first spacer layer and a second spacer layer are formed opposite a major surface of a substrate. The second spacer layer is removed using the first spacer layer as a stop layer. The removal of the second spacer layer forms an air-gap spacer in an area previously occupied by the second spacer layer.

10 Claims, 8 Drawing Sheets

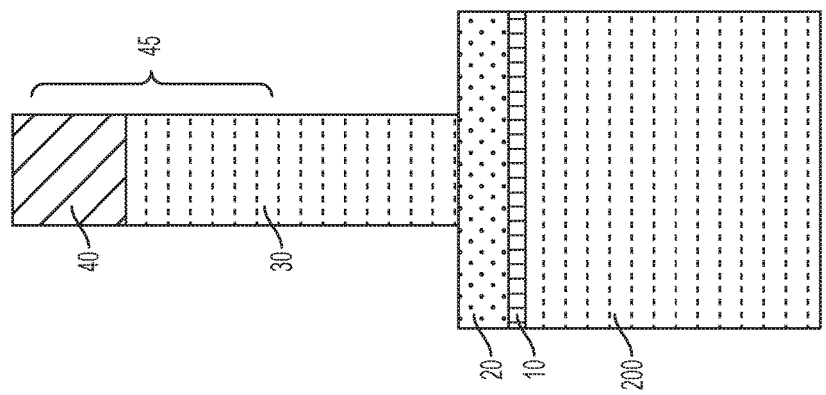
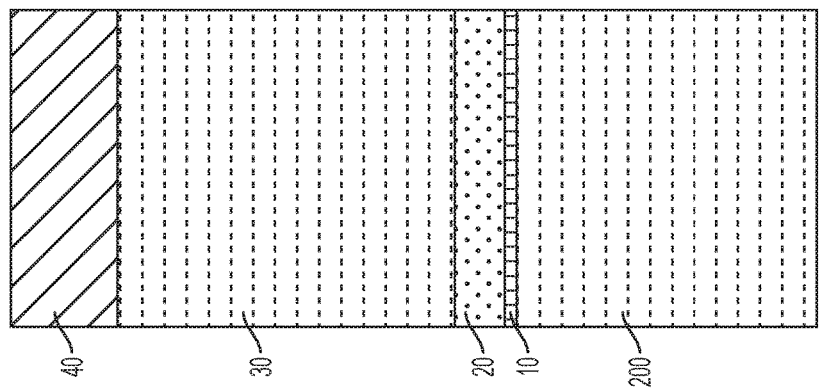

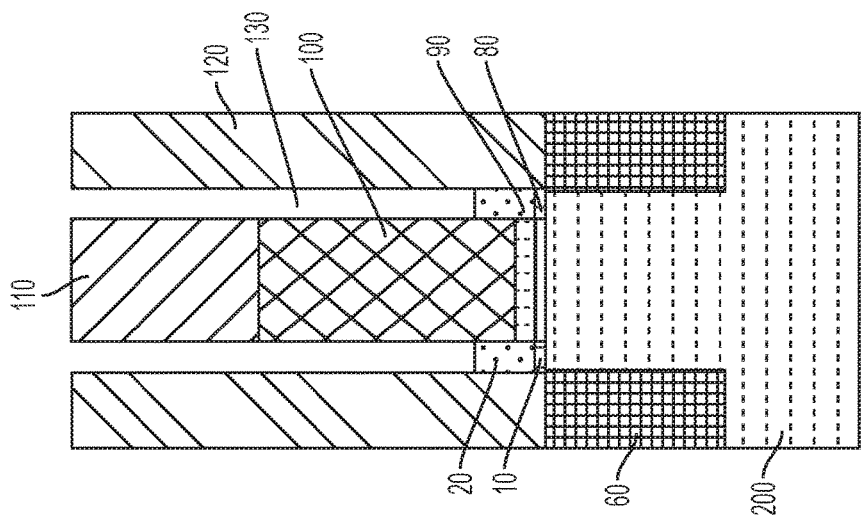
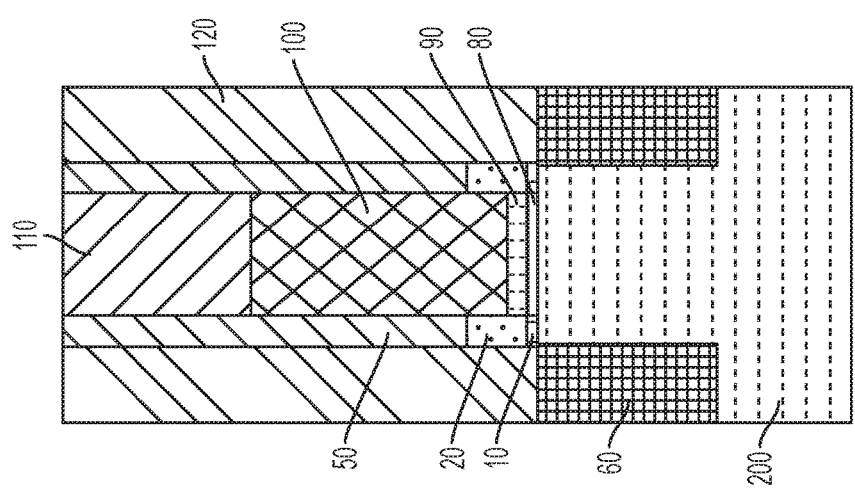

FIELD EFFECT TRANSISTOR AIR-GAP SPACERS WITH AN ETCH-STOP LAYER

BACKGROUND

The present invention relates in general to fabrication methodologies and resulting structures for semiconductor devices. More specifically, the present invention relates to a multi-layer spacer structure for forming air-gap spacers with an etch-stop layer in fin-type field effect transistors (Fin-FETs).

A FinFET is a FET structure that has a conducting channel wrapped by a thin piece of silicon "fin". The thickness of the fin determines an effective channel length of the device. A FinFET can include air-gap spacers, which can provide enhanced electrical performance by reducing parasitic capacitance between a gate and source/drain regions of the FinFET.

SUMMARY

One or more embodiments of the invention provide a method for forming a semiconductor structure. The method includes forming a first spacer layer opposite a major surface of a substrate. A second spacer layer can be formed on an opposite side of the first spacer layer from the major surface of the substrate. The second spacer layer can be removed using the first spacer layer as a stop layer in which the removal of the second spacer layer forms an air-gap spacer in an area previously occupied by the second spacer layer. The first spacer layer can be comprised of a first dielectric material and the second spacer layer can be comprised of a second dielectric material in which the second dielectric material has an etch selectivity relative to the first dielectric material.

One or more embodiments of the invention provide a method for forming a semiconductor structure. The method includes forming a first spacer layer opposite a major surface of a substrate. A second spacer layer can be formed on an opposite side of the first spacer layer from the major surface of the substrate. The method includes performing an etching process on the semiconductor structure to remove the second spacer layer, in which the removal of the second spacer layer forms an air-gap spacer in an area previously occupied by the second spacer layer and the first spacer layer acts as a uniform etch-stop layer during the etching process.

One or more embodiments of the invention provide a semiconductor structure. The semiconductor structure includes a first spacer layer opposite a major surface of a substrate. The semiconductor structure includes a second spacer layer that can be formed on an opposite side of the first spacer layer from the major surface of the substrate. The second spacer layer of the semiconductor structure can be removed using the first spacer layer as a stop layer in which the removal of the second spacer layer forms an air-gap spacer in an area previously occupied by the second spacer layer. The first spacer layer can be comprised of a first dielectric material and the second spacer layer can be comprised of a second dielectric material in which the second dielectric material has an etch selectivity relative to the first dielectric material.

BRIEF DESCRIPTION OF THE DRAWINGS

The subject matter of invention is particularly pointed out and distinctly defined in the claims at the conclusion of the specification. The foregoing and other features and advantages are apparent from the following detailed description taken in conjunction with the accompanying drawings in which:

FIG. 4 depicts a cross-sectional view of the semiconductor structure during an intermediate operation of a method of fabricating a semiconductor device according to one or more embodiments of the present invention;

FIG. 5 depicts a cross-sectional view of the semiconductor structure during an intermediate operation of a method of fabricating a semiconductor device according to one or more embodiments of the present invention;

FIG. 12 depicts a cross-sectional view of the semiconductor structure during an intermediate operation of a method of fabricating a semiconductor device according to one or more embodiments of the present invention; and FIG. 13 depicts a cross-sectional view of the semiconductor structure during an intermediate operation of a method of fabricating a semiconductor device according to one or more embodiments of the present invention.

DETAILED DESCRIPTION

Figure 1A:
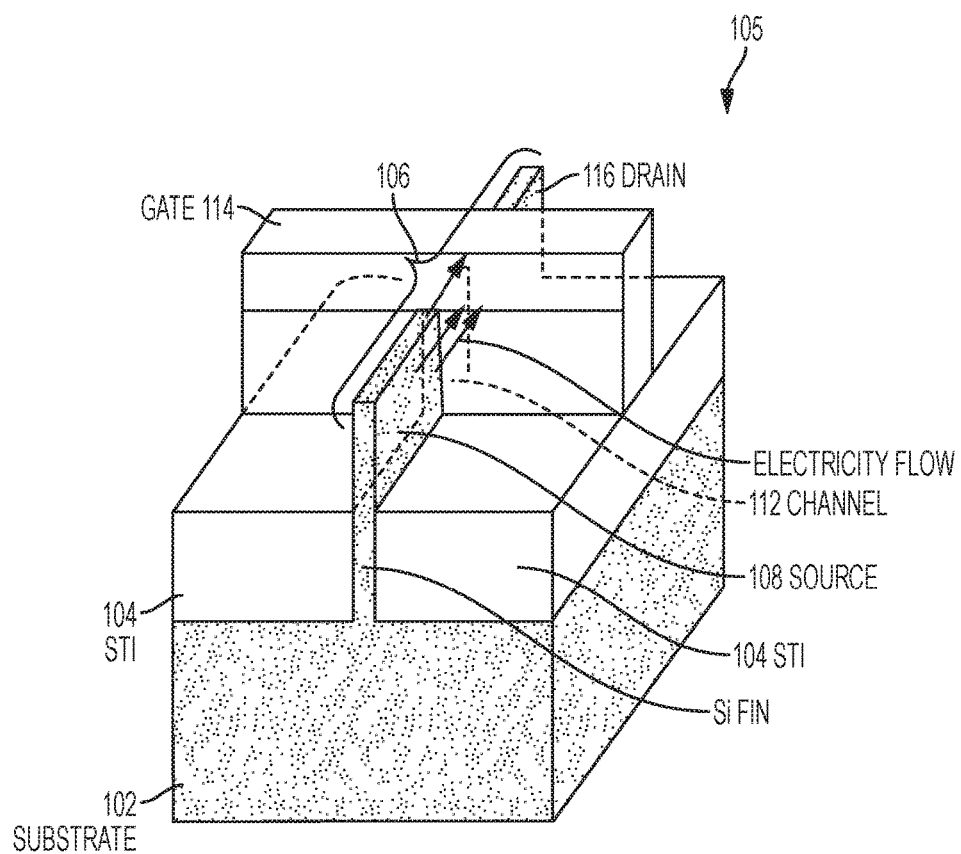
FIG. 1A depicts a three-dimensional view of an exemplary configuration of a known FinFET device.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch-stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

Turning now to a more detailed description of technologies that are more specifically relevant to embodiments of the present invention, as previously described herein, semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

One particularly advantageous type of MOSFET is known generally as a fin-type field effect transistor (FinFET). FIG. 1A depicts a three-dimensional view of an exemplary FinFET 105, which includes a shallow trench isolation (STI) region 104 for isolation of active areas from one another. The basic electrical layout and mode of operation of FinFET 105 do not differ significantly from a traditional field effect transistor. FinFET 105 includes a semiconductor substrate 102, local STI region 104, a fin 106, and a gate 114 having a gate oxide layer (not shown) between the gate and the fin, configured and arranged as shown. Fin 106 includes a source region 108, a drain region 116, and a channel region 112, wherein gate 114 extends over the top and sides of channel region 112. For ease of illustration, a single fin is shown in FIG. 1. In practice, FinFET devices are fabricated having multiple fins formed on local STI region 104 and substrate 102. Substrate 102 can be silicon, and local STI region 104 can be an oxide (e.g., SiO$_2$). Fin 106 can be silicon. Gate 114 controls the source to drain current flow (labeled ELECTRICITY FLOW in FIG. 1). In contrast to a planar MOSFET, however, source 108, drain 116, and channel 112 are built as a three-dimensional bar on top of local STI region 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The source and drain regions can be suitably doped to produce the desired FET polarity, as is known in the art. The dimensions of the fin establish the effective channel length for the transistor.

The inclusion of air-gap spacers in a FinFET can provide enhanced electrical performance by reducing parasitic capacitance between the gate and the source/drain regions of the FinFET. However, challenges arise in the formation of air-gap spacers because known methods of forming an air-gap spacer use a timed etch operation to determine the depth of the air-gap spacer. This etching process results in a high aspect spacer having a very narrow and deep trench, which produces a loading effect within the spacer. The high aspect ratio air-gap spacers make it difficult to control when the etching process ends, particularly when a stop layer is not utilized during a fixed time etching process. Accordingly, the resulting air-gap spacers formed by the described operation are non-uniform with varied thicknesses and depths.

Turning now to an overview of aspects of the present invention, one or more embodiments of the invention provide methods and structures configured to provide an etch-stop to help control air-gap spacer formation within a semiconductor structure. In one or more embodiments of the invention, a first spacer layer includes a different material from a second spacer layer. The second spacer layer can be etched to form an air-gap, i.e., air-gap spacer, in which the first spacer layer can act as an etch-stop when removing at least a portion of the second spacer layer. The first spacer layer provides a uniform stop layer for the etching of the second spacer layer. Methods for forming a semiconductor structure and semiconductor structures in accordance with embodiments of the invention are described in detail below by referring to the accompanying drawings in FIGS. 1-13.

Figure 1B:
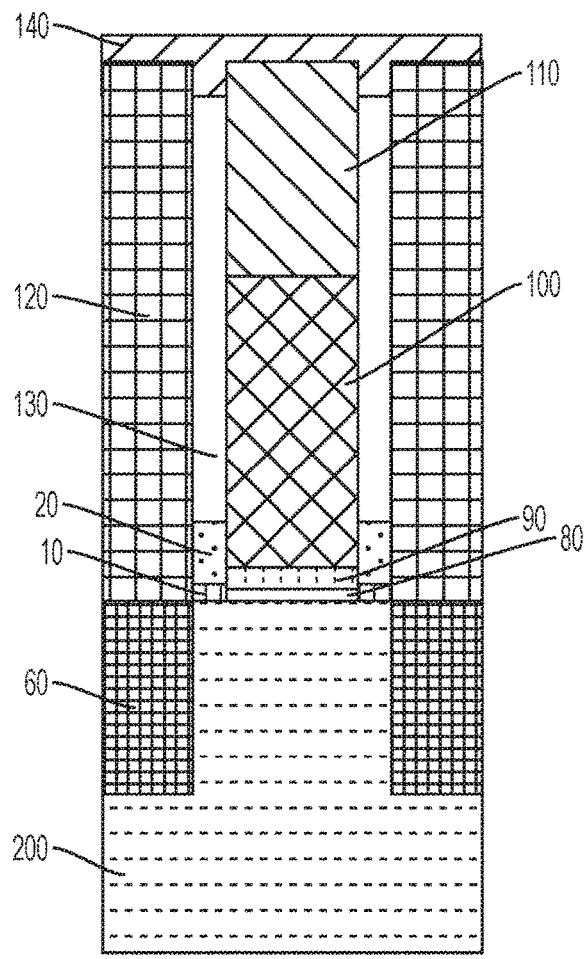
FIG. 1B depicts a cross-sectional view of a FinFET semiconductor structure according to one or more embodiments of the present invention.

FIG. 1B depicts a cross-sectional view of a FinFET semiconductor structure during an intermediate operation of a method of fabricating a semiconductor device according to one or more embodiments. As depicted in FIG. 1, a FinFET structure can include an air-gap spacer that can be defined by an air-gap 130 enclosed by one or more contacts 120, a first spacer layer 20, a gate 100, a self-aligned contact (SAC) cap 110, and capping layer 140. The FinFET structure can additionally include a liner 10, one or more epitaxial portions 60, dielectric material 80, work function metal 90, and a substrate 200.

While FIG. 1B discloses the FinFET semiconductor structure having the SAC cap 110, the SAC cap 110 is not necessary in all embodiments of the FinFET semiconductor structure disclosed herein. In other embodiments, the gate 100 can be flush with the one or more contacts 120.

Figure 2:
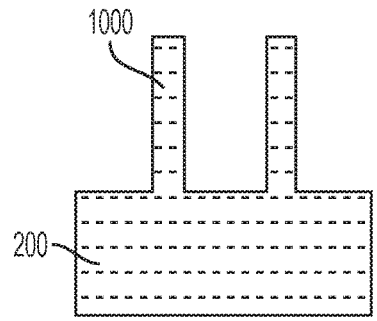
FIG. 2 depicts a cross-sectional view of the semiconductor structure during an intermediate operation of a method of fabricating a semiconductor device according to one or more embodiments of the present invention.

FIG. 2 depicts a cross-sectional, e.g., cross-fin, of a semiconductor structure during an intermediate operation of a method of fabricating a semiconductor device according to one or more embodiments. As depicted in FIG. 2, the fin 1000 can be, for example, a tall, thin semiconductor, which can be etched from a semiconductor substrate 200, for example, a bulk semiconductor material such as silicon, or a semiconductor-on-insulator (SOI) substrate including a handle substrate, a buried insulator layer, and a top semiconductor layer.

In some embodiments of the invention, the substrate 200 can be any suitable semiconductor material, such as, for example, Si, Ge, SiGe, SiC, SiGeC, and III/V compound semiconductors. The substrate 200 can provide mechanical support to the buried insulator layer and the top semiconductor layer. The thickness of the handle substrate can be, for example, from 30 µm to about 2 mm.

The buried insulator layer can be any suitable dielectric material such as silicon oxide, silicon nitride, silicon oxynitride, or a combination thereof. The thickness of the buried insulator layer can be from 50 nm to 200 nm, for example, from 100 nm to 150 nm.

The top semiconductor layer can be any suitable semiconductor material such as, for example, Si, Ge, SiGe, SiC, SiGeC, and III/V compound semiconductors such as, for example, InAs, GaAs, and InP. The semiconductor materials of the top semiconductor layer and the handle substrate can be the same or different. Each of the handle substrate and the top semiconductor layer can include a single crystalline semiconductor material, such as, for example, single crystalline silicon. The top semiconductor layer may or may not be doped with p-type dopants and/or n-type dopants. Examples of p-type dopants include, for example, boron, aluminum, gallium, and indium. Examples of n-type dopants include antimony, arsenic and phosphorous. The thickness of the top semiconductor layer can be from 10 nm to 200 nm, for example, from 30 nm to 70 nm.

The top semiconductor layer can be doped with p-type dopants and/or n-type dopants. The term "p-type" refers to the addition of impurities to an intrinsic semiconductor that creates deficiencies of valence electrons, and examples of p-type dopants include, for example, boron, aluminum, gallium, and indium. "N-type" refers to the addition of impurities that contributes free electrons to an intrinsic semiconductor. The doping can be achieved utilizing ion implantation or gas phase doping, and examples of n-type dopants, include, for example, antimony, arsenic and phosphorous.

The top semiconductor layer can be patterned to form a plurality of semiconductor fins 1000. In some embodiments of the invention, the semiconductor fins 1000 can be formed by lithography and etching. The lithographic step can include applying a photoresist layer, exposing the photoresist layer to a desired pattern of radiation, and developing the exposed photoresist layer utilizing a resist developer. The etching process can include dry etching and/or wet chemical etching. Examples of dry etching processes that can be used include reactive ion etching (RIE), ion beam etching, plasma etching or laser ablation. The etching process can transfer the pattern from the patterned photoresist layer to the top semiconductor layer, and thereafter to underlying top semiconductor layer utilizing the buried insulator layer as an etch-stop. After transferring the pattern into the top semiconductor layer, the patterned photoresist layer can be removed utilizing a resist stripping process such as, for example, ashing. In some embodiments of the invention, the semiconductor fins 1000 can also be formed utilizing a sidewall image transfer (SIT) process. In an SIT process, spacers can be formed on a dummy mandrel. The dummy mandrel can be removed and the remaining spacers can be used as a hard mask to etch the top semiconductor layer. The spacers can then be removed after the semiconductor fins 1000 have been formed.

Each of the semiconductor fins 1000 can have a height ranging from 1 nm to 150 nm, for example, from 10 nm to 50 nm. Each of the semiconductor fins 1000 can have a width ranging from 1 nm to 100 nm, for example, from 10 nm to 20 nm. Adjacent semiconductor fins 1000 can be separated by a pitch ranging from 20 nm to 100 nm, for example, from 30 nm to 50 nm.

Figure 3A:
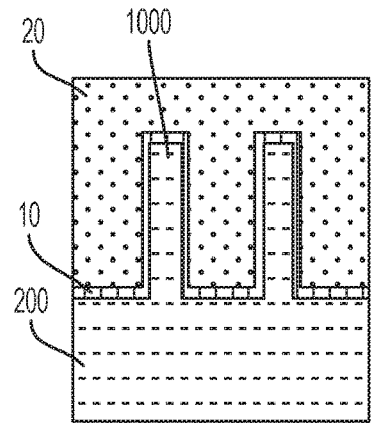
FIG. 3A depicts a cross-sectional view of the semiconductor structure during an intermediate operation of a method of fabricating a semiconductor device according to one or more embodiments of the present invention.
Figure 3B:
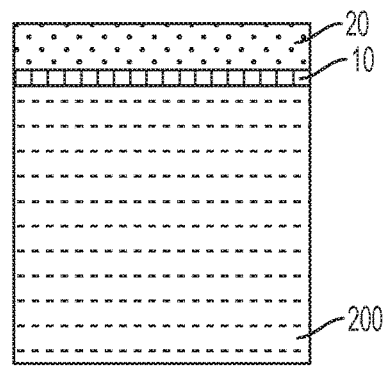
FIG. 3B depicts a different cross-sectional view of the semiconductor structure shown in FIG. 3A.

FIG. 3A depicts a cross-sectional, e.g., cross-fin, view of the semiconductor structure during an intermediate operation of a method of fabricating a semiconductor device according to one or more embodiments. FIG. 3B depicts a different cross-sectional, e.g., cross-gate, view of the semiconductor structure shown in FIG. 3A. As depicted in FIG. 3A and FIG. 3B, a liner 10 can be deposited and first spacer layer 20 can fill a shallow trench isolation (STI) structure and can be formed on STI structure and the fins 1000. A CMP operation can be performed on a surface of the first spacer layer 20 to smooth the surface of the first spacer layer 20.

The liner 10 can be any suitable dielectric material, for example, carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof. In some embodiments of the invention, the liner 10 can include silicon nitride. The liner 10 can be formed utilizing a deposition process such as, for example, CVD, plasma enhanced chemical vapor deposition (PECVD), or chemical solution deposition.

The first spacer layer 20 can be any suitable dielectric material, such as silicon oxide, silicon oxynitride, or a combination thereof, and can be formed using a deposition process. The first spacer layer 20 can be deposited onto the liner 10 utilizing any available deposition technology.

FIG. 4 depicts a cross-sectional, e.g., cross-gate, view of the semiconductor structure during an intermediate operation of a method of fabricating a semiconductor device according to one or more embodiments. As depicted in FIG. 4, a silicon layer 30 and a hard mask layer 40 can be deposited on top of the first spacer layer 20, the liner 10 and the substrate 200. The silicon layer 30 and the hard mask layer 40 can be formed utilizing a deposition process such as, for example, CVD, PECVD, or chemical solution deposition.

The silicon layer 30 can include, for example, amorphous silicon or polysilicon. The hard mask layer 40 can include an oxide, nitride, oxynitride, or any combination thereof including multi-layers. In some embodiments of the invention, the hard mask layer 40 can include silicon nitride.

FIG. 5 depicts a cross-sectional view of the semiconductor structure during an intermediate operation of a method of fabricating a semiconductor device according to one or more embodiments. As depicted in FIG. 5, a dummy gate 45 including the silicon layer 30 and the hard mask 40 can be formed to assist in the formation of a sidewall spacer, which can be a two-segment spacer, for example, by etching.

Figure 6:
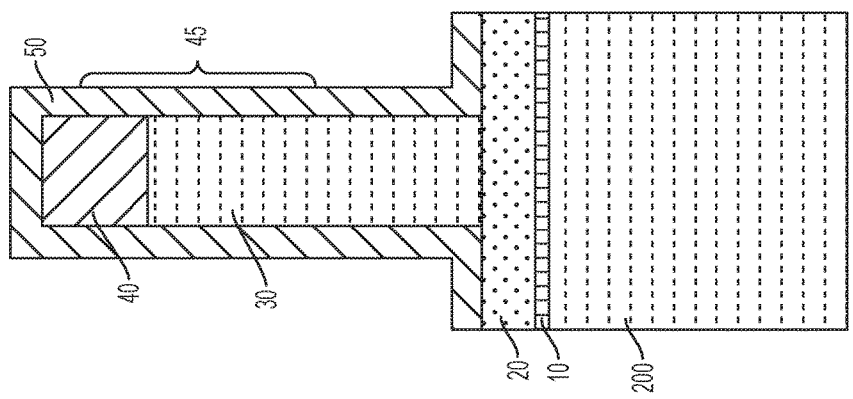
FIG. 6 depicts a cross-sectional view of the semiconductor structure during an intermediate operation of a method of fabricating a semiconductor device according to one or more embodiments of the present invention.

FIG. 6 depicts a cross-sectional view of the semiconductor structure during an intermediate operation of a method of fabricating a semiconductor device according to one or more embodiments. As depicted in FIG. 6, a second spacer layer 50 can be deposited on the dummy gate 45 and first spacer layer 20. The second spacer layer 50 can be deposited onto the dummy gate 45 and first spacer layer 20 utilizing any available deposition technology, for example, ALD.

The second spacer layer 50 can be any suitable low dielectric constant (k), i.e., low-k, material. The low-k material can be a dielectric having a dielectric constant less than about 7, for example, less than about 5 or even less than about 2.5, such as carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof. In some embodiments of the invention, the layer 50 can include SiBCN.

In some embodiments of the invention, the second spacer layer 50 can include a different material from the first spacer layer 20. For example, the second spacer layer 50 can be selective to the first spacer layer 20, e.g., the second spacer layer 50 can have an etch selectivity relative to the first spacer layer 20. During etching of the second spacer layer 50, the first spacer layer 20 can act as an etch-stop.

Figure 7:
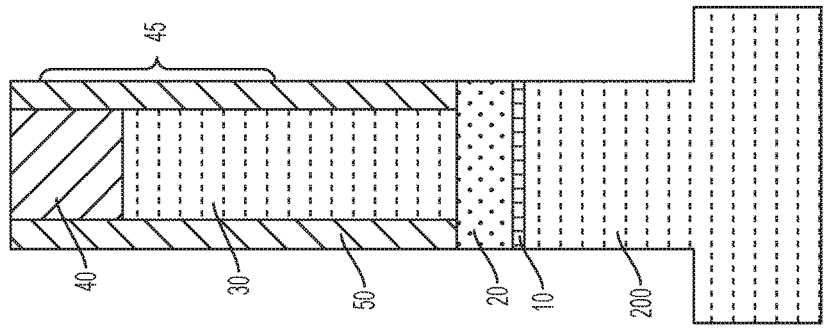
FIG. 7 depicts a cross-sectional view of the semiconductor structure during an intermediate operation of a method of fabricating a semiconductor device according to one or more embodiments of the present invention.

FIG. 7 depicts a cross-sectional view of the semiconductor structure during an intermediate operation of a method of fabricating a semiconductor device according to one or more embodiments. As depicted in FIG. 7, a portion of the second spacer layer 50 can be removed using an etching process, for example ME. RIE can use chemically reactive plasma to remove a material, such as a masked pattern of semiconductor material, by exposing the material to a bombardment of ions that dislodge portions of the material from the exposed surface.

In addition, the STI can be recessed, for example, etching by ME, to a target height, the first spacer layer 20 and liner 10 can be stripped according to stripping processes mentioned within this specification or any other known stripping process, and the fin 1000 can be recessed. The target height can be similar or slightly larger than a target fin height such as 1nm to 150 nm.

Figure 8:
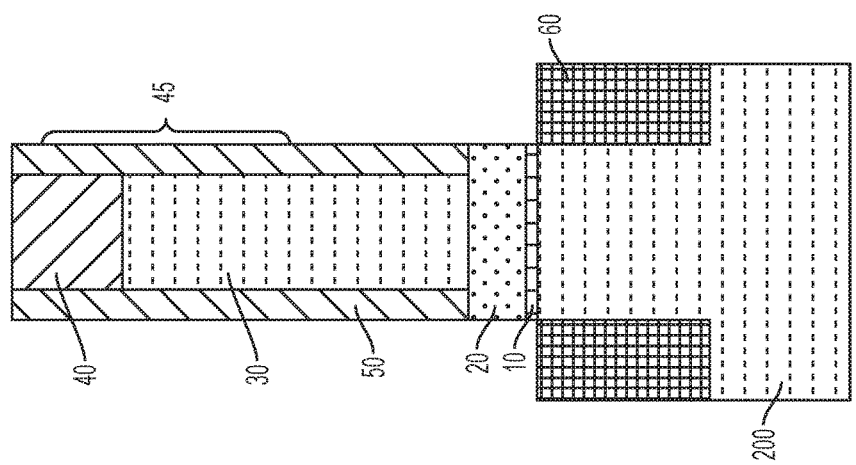
FIG. 8 depicts a cross-sectional view of the semiconductor structure during an intermediate operation of a method of fabricating a semiconductor device according to one or more embodiments of the present invention.

FIG. 8 depicts a cross-sectional view of the semiconductor structure during an intermediate operation of a method of fabricating a semiconductor device according to one or more embodiments. As depicted in FIG. 8, epitaxial portions 60 can be grown on the recessed portion of fin 1000.

Epitaxial materials can be grown from gaseous or liquid precursors. Epitaxial materials can be grown using, for example, vapor-phase epitaxy (VPE), molecular-beam epitaxy (MBE), or liquid-phase epitaxy (LPE). Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from about $1 \times 10^{19}$ cm$^{-3}$ to about $2 \times 10^{21}$ cm$^{-3}$, for example, between about $2 \times 10^{20}$ cm$^{-3}$ to about $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface may take on a {100} orientation. In embodiments, epitaxial growth and/or deposition processes may be selective to forming on semiconductor surface, and may not deposit material on exposed surfaces, such as silicon dioxide or silicon nitride surfaces.

In embodiments, the gas source for the deposition of epitaxial semiconductor material can include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. An epitaxial germanium layer can be deposited from a germanium gas source that is selected from the group consisting of germane, digermane, halogermane, dichlorogermane, trichlorogermane, tetrachlorogermane, and combinations thereof. An epitaxial silicon germanium alloy layer can be formed utilizing a combination of such gas sources. Carrier gases like hydrogen, nitrogen, helium, and argon can be used.

Figure 9:
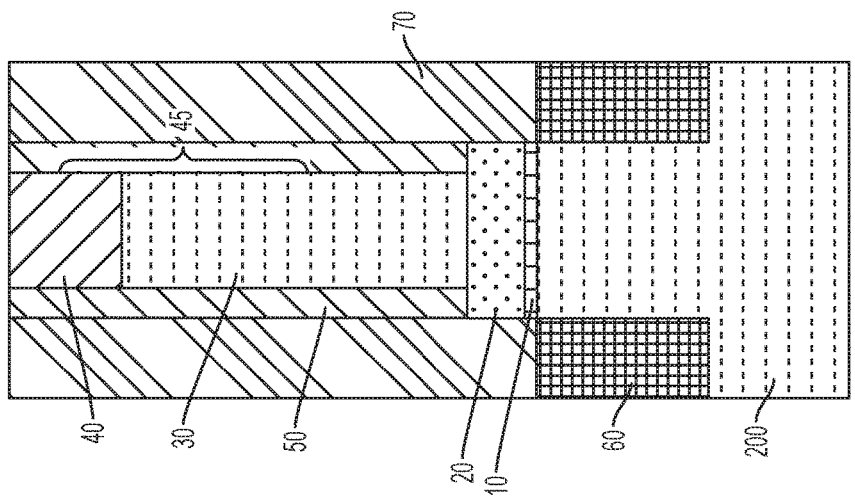
FIG. 9 depicts a cross-sectional view of the semiconductor structure during an intermediate operation of a method of fabricating a semiconductor device according to one or more embodiments of the present invention.

FIG. 9 depicts a cross-sectional view of the semiconductor structure during an intermediate operation of a method of fabricating a semiconductor device according to one or more embodiments. As depicted in FIG. 9, an interlayer dielectric (ILD) layer 70 can be formed on the epitaxial portions 60. The ILD layer 70 can be, for example, an oxide such as a silicon oxide. Any suitable known manner of forming the ILD layer can be utilized.

Figure 10:
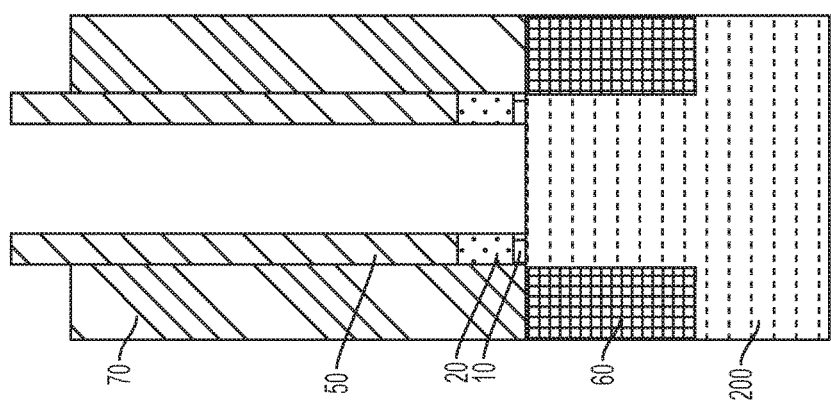
FIG. 10 depicts a cross-sectional view of the semiconductor structure during an intermediate operation of a method of fabricating a semiconductor device according to one or more embodiments of the present invention.

FIG. 10 depicts a cross-sectional view of the semiconductor structure during an intermediate operation of a method of fabricating a semiconductor device according to one or more embodiments. As depicted in FIG. 10, the dummy gate 45 can be removed, which can include removing the hard mask layer 40, the silicon layer 30, and a portion of the first spacer layer 20 under the hard mask layer 40 and the silicon layer 30. Hard mask layer 40 can be removed by, for example, RIE and layer 30 can be removed by wet etching, such as ammonium hydroxide. Removal of a portion of layer 20 can occur using a self-aligned ME having a selectivity in reference to the liner 10. In addition, an exposed portion of liner 10 under the hard mask layer 40, the silicon layer 30, and the first spacer layer 20 can be stripped by, for example, wet etching.

Figure 11:
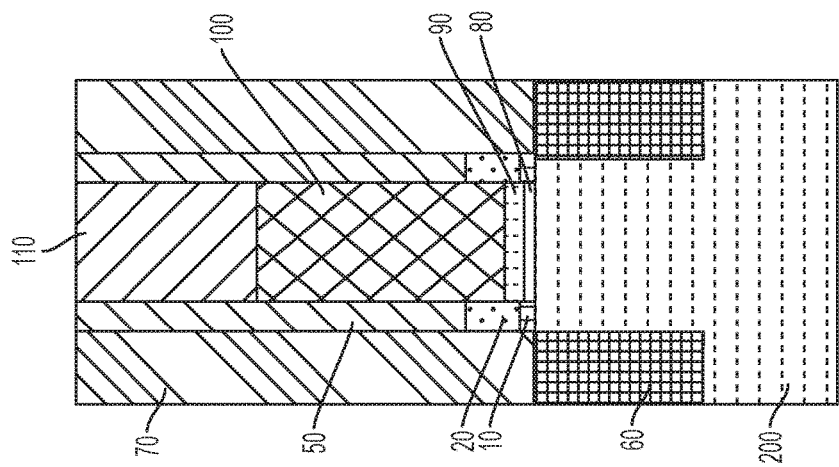
FIG. 11 depicts a cross-sectional view of the semiconductor structure during an intermediate operation of a method of fabricating a semiconductor device according to one or more embodiments of the present invention.

FIG. 11 depicts a cross-sectional view of the semiconductor structure during an intermediate operation of a method of fabricating a semiconductor device according to one or more embodiments. As depicted in FIG. 11, dielectric material 80, work function metal 90, and gate 100 can be deposited. A CMP operation can be performed and a coplanar, e.g., flat, top surface and self-aligned contact (SAC) cap 110 can be formed. In some embodiments of the invention, a height of the first spacer layer 20 can be lower than a height of the dielectric material 80, e.g., in a direction of stacking of the dielectric material 80, work function metal 90, and gate 100. The first spacer layer 20 can reside on the sidewall of gate 100, for example, between adjacent fins 1000.

The dielectric material 80 can be any suitable high dielectric constant (k), i.e., high-k, material having a dielectric constant greater than silicon dioxide. Exemplary high-k material include, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2.

The work function metal 90 can be any suitable metal, for example, aluminum, lanthanum oxide, magnesium oxide, strontium titanate, strontium oxide, titanium nitride, titanium aluminum nitride, titanium aluminum carbide, tantalum nitride, and combinations thereof. The gate 100 can be any suitable conductive metal, such as, for example, tungsten. The SAC cap 110 can be any suitable dialectic material, for example, a nitride material, such as, silicon nitride (SiN). The SAC cap 110 can act as a protective material over the gate 100.

FIG. 12 depicts a cross-sectional view of the semiconductor structure during an intermediate operation of a method of fabricating a semiconductor device according to one or more embodiments. As depicted in FIG. 12, the ILD layer 70 can be removed to expose source/drain regions of the semiconductor structure according to an etching process, for example, contact etching. Additionally, contacts 120, e.g., trench silicide (TS) contacts, can be formed in the region where the ILD layer 70 was removed. The contacts 120 can be formed above the source/drain regions of the semiconductor structure. Any known manner of forming the contacts 120 can be utilized.

FIG. 13 depicts a cross-sectional view of the semiconductor structure during an intermediate operation of a method of fabricating a semiconductor device according to one or more embodiments. As depicted in FIG. 13, the second spacer layer 50 can be removed by an etching process. Any known manner of etching can be utilized to remove the second spacer layer 50. During this etching process, the first spacer layer 20, the composition of which can be of a different material than the second spacer layer 50, can serve as an etch-stop layer. The first spacer layer 20 can provide a uniform stop layer during the removal of the second spacer layer 50. The removal of the second spacer layer can form an air-gap 130 within the semiconductor structure.

The air-gap 130 can be formed by RIE and can have a high aspect ratio. Air in the air-gap 130 can have a lower dielectric constant than the second spacer layer 50. Utilizing air as a dielectric can reduce or minimize parasitic capacitance between the gate 100 and the contacts 120.

Capping layer 140 can be formed at a top of the air-gap 130 to pinch off, e.g., close, the air-gap 130 thereby forming an air-gap spacer. With further reference to FIG. 1, as previously described herein, the air-gap spacer can be defined by the air-gap 130 enclosed by the contact 120, the first spacer layer 20, the gate 100, the SAC cap 110, and capping layer 140. Additionally, in some embodiments the SAC cap 110 can be removed after air-gap 130 is formed. Accordingly, the air-gap spacer can also be defined by the air-gap 130 enclosed by the contact 120, the first spacer layer 20, the gate 100, and capping layer 140. The capping layer 140 can be any suitable dielectric material, for example, carbon containing silicon materials such as silicon carbides, silicon nitrides (SiN) or carbon containing silicon nitride materials (SiCN), and/or boron nitride (BN), silicon boron nitride (SiBN), silicon boron carbide nitride (SiBCN), porous dielectric, or combinations thereof. In some embodiments of the invention, the liner 10 can include silicon nitride. In forming the capping layer 140, a layer of the material forming the capping layer can be formed on a portion or all of the boundaries of the air-gap 130, e.g., on exposed surfaces of the contact 120, the first spacer layer 20, the gate 100, and the SAC cap 110.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to explain the principles of the embodiment, the practical application or technical improvement over technologies found in the marketplace, or to enable others of ordinary skill in the art to understand the embodiments described herein.

What is claimed is:

1. A method for forming a semiconductor structure, the method comprising:
   forming a first spacer layer opposite a major surface of a substrate;
   forming a second spacer layer on an opposite side of the first spacer layer from the major surface of the substrate, wherein sidewalls associated with the first spacer layer are coplanar to sidewalls associated with the second spacer layer at an interface between the first spacer layer and the second spacer layer; and
   removing the second spacer layer using the first spacer layer as a stop layer, wherein the removal of the second spacer layer forms an air-gap spacer in an area previously occupied by the second spacer layer;
   wherein the first spacer layer is comprised of a first dielectric material and the second spacer layer is comprised of a second dielectric material, the second dielectric material having an etch selectivity relative to the first dielectric material.

2. The method of claim 1, wherein the second dielectric material has a lower dielectric constant than the first dielectric material.

3. The method of claim 1, wherein the air-gap spacer has a lower dielectric than the second dielectric material.

4. The method of claim 1, wherein the air-gap spacer forms a component of fin-type field effect transistors (FinFET).

5. The method of claim 4, wherein the air-gap spacer is bounded by one or more further components of the FinFET.

6. The method of claim 1, wherein an etching process is used to remove the second spacer layer.

7. The method of claim 6, wherein the first spacer layer provides a uniform stop layer during the etching process to remove the second spacer layer.

8. A method for forming a semiconductor structure, the method comprising:
   forming a first spacer layer opposite a major surface of a substrate;
   forming a second spacer layer on an opposite side of the first spacer layer from the major surface of the substrate, wherein sidewalls associated with the first spacer layer are coplanar to sidewalls associated with the second spacer layer at an interface between the first spacer layer and the second spacer layer; and
   performing an etching process on the semiconductor structure to remove the second spacer layer, in which the removal of the second spacer layer forms an air-gap spacer in an area previously occupied by the second spacer layer, wherein the first spacer layer acts as a uniform etch-stop layer during the etching process.

9. The method of claim 8 further comprising:
   removing a portion of the first spacer layer;
   forming a gate along a remaining portion of the first spacer layer and the second spacer layer;
   forming contacts along an opposite side of the first and second spacer layers;
   forming a contact cap above the gate; and
   forming a capping layer above the contacts, the air-gap and the contact cap.

10. The method of claim 8, wherein the first spacer layer is comprised of a first dielectric material and the second spacer layer is comprised of a second dielectric material, the second dielectric material having an etch selectivity relative to the first dielectric material.

* * * * *